United States Patent
Inoue et al.

(10) Patent No.: US 8,258,400 B2
(45) Date of Patent: Sep. 4, 2012

(54) STORAGE CASE (75) Inventors: Yukari Inoue, Toyota (JP); Hitoshi Imura, Chiryu (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 547 days.

(21) Appl. No.: 12/296,491

(22) PCT Filed: Apr. 18, 2007

(86) PCT No.: PCT/IB2007/001005
§ 371 (c)(1),
(2), (4) Date: Oct. 8, 2008

(87) PCT Pub. No.: WO2007/122468
PCT Pub. Date: Nov. 1, 2007

(65) Prior Publication Data
US 2009/0223695 A1    Sep. 10, 2009

(30) Foreign Application Priority Data

Apr. 20, 2006  (JP) .................................. 2006-116839

(51) Int. Cl.
*H05K 5/06* (2006.01)
(52) U.S. Cl. ............ 174/50; 174/17 R; 174/58; 439/535; 248/906; 361/600
(58) Field of Classification Search .................. 174/50, 174/17 R, 58; 439/535; 220/4.02; 361/600
See application file for complete search history.

(56) References Cited

U.S. PATENT DOCUMENTS

| | | | |
|---|---|---|---|
| 3,014,162 A | 12/1961 | Carlisle | |
| 5,045,971 A * | 9/1991 | Ono et al. | 361/704 |
| 6,323,418 B1 * | 11/2001 | Tiburtius et al. | 174/387 |
| 7,554,033 B1 * | 6/2009 | Bhosale et al. | 174/53 |
| 7,807,923 B2 * | 10/2010 | Moran | 174/50 |
| 2004/0095732 A1 | 5/2004 | Azumi et al. | |

FOREIGN PATENT DOCUMENTS

| | | |
|---|---|---|
| CN | 2454962 Y | 10/2001 |
| CN | 2741157 Y | 11/2005 |
| JP | 680317 U | 11/1994 |
| JP | 2000-217227 A | 8/2000 |
| JP | 2002238142 A | 8/2002 |
| JP | 2004-166413 A | 6/2004 |
| JP | 2004-186039 A | 7/2004 |
| JP | 2004328929 A | 11/2004 |
| JP | 2004357462 A | 12/2004 |
| JP | 2005192311 A | 7/2005 |

OTHER PUBLICATIONS

Chinese Office Action corresponding to Chinese Patent Application No. 200780014237.3 dated May 21, 2010, 8 pages.
Japanese Patent Office Action dated Jun. 7, 2011.

* cited by examiner

*Primary Examiner* — Dhirubhai R Patel
(74) *Attorney, Agent, or Firm* — Sughrue Mion, PLLC (57) ABSTRACT

A storage case (300) includes a case body (320) formed by joining a plurality of members (301, 302) with a joint structure (303a, 303b, 304), an opening (16) formed in the case body (320), a closure member (14) capable of closing the opening (16), a seal structure (17) provided between the case body (320) and the closure member (14), and a foreign-matter guide portion (10) provided on an outer surface of the case body (320), aside from the joint structure (303a, 303b, 304), such that the foreign-matter guide portion is located above the seal structure in the vertical direction of the storage case.

13 Claims, 13 Drawing Sheets

STORAGE CASE

FIELD OF THE INVENTION

The invention relates to storage cases in which objects are housed.

BACKGROUND OF THE INVENTION

Some examples of storage cases are disclosed in JP-A-2004-186039, JP-A-2004-166413 and JP-A-2000-217227. Each of the storage cases includes a storage case body in which certain objects, such as electrical devices or equipment, are housed, and into which entry of water; or the like, from the outside is prevented or restricted. The storage case allows connection between the stored objects and other electrical devices disposed outside the storage case body.

The storage cases as described above employ a seal structure so as to allow communication with the outside of the storage case body while preventing or restricting entry of water, or the like, into the storage case body.

The storage case employing the seal structure includes an opening in which wiring for connecting the stored object(s) and the outside electric device(s) is provided, a closure member for closing the opening while allowing connection between the inside and outside of the storage case body and the seal structure that inhibits or restricts entry of water, or the like, into the storage case body through an interface between the storage case body and the closure member.

The seal structure includes a seal member, such as an O ring, which is sandwiched by and between the outer surface of the storage, case body and the closure member. In the presence of the seal member, a clearance is likely to appear between the closure member and the outer surface of the storage case.

The storage case employing the seal structure as described above provides a certain waterproof effect, and is thus often exposed to an environment where the storage case body is subjected to water, or the like.

In some cases, water containing foreign matter may contact a surface of the storage case body which is located above the opening of the storage case. Then, the water may flow downward on the outer surface of the storage case body, and enter the clearance between the closure member and the outer surface of the storage case body, resulting in contact of the water containing foreign matter with the seal member.

The water reaching the seal member is initially prevented by the seal member from moving into the storage case body, and the foreign matter contained in the water is deposited on the seal member. Then, the seal member may degrade with time due to the foreign matter deposited on the seal member, and the sealing surface pressure of the seal member may be reduced. As a result, the waterproofing function of the seal member may deteriorate, and water, or the like, may enter the storage case.

To avoid the above-described situation, the seal member may be formed of a highly functional material capable of withstanding the foreign matter. The use of the seal member, however, gives rise to a problem of increased cost.

DISCLOSURE OF THE INVENTION

The object of the invention is to provide a storage case including a seal structure, which achieves improved water resistance of its storage case body at a reduced cost.

One aspect of the invention relates to a storage case. The storage case includes a a case body formed by joining a plurality of members with a joint structure, an opening formed in the case body, a closure member capable of closing the opening, a seal structure provided between the case body and the closure member, and a foreign-matter glide portion provided on an outer surface of the case body, aside from the joint structure, such that the foreign-matter guide portion is located above the seal structure in a vertical direction of the storage case.

The foreign-matter guide portion may protrude outward from the outer surface of the case body so as to extend beyond the closure member.

The foreign-matter guide portion may be located above the closure member, and opposite ends of the foreign-matter guide portion are positioned further outward, in the lateral direction of the closure member, than the opposite ends of the closure member.

The storage case may further include an inverter that is housed in the case body and is capable of functioning as a power converter, and the closure member may be provided with a connecting device to which a coupling member for electrically coupling the inverter with an electric device located outside the case body can be connected.

The closure member may be in the form of a drain plug through which outside air can be supplied into the storage case.

One of the members forming the case body may be provided with the foreign-matter guide portion, and the above-indicated one member may be formed using a mold having an integral pattern of the member and the foreign-matter guide portion.

The case body may be formed by joining the above-indicated members by welding.

The foreign-matter guide portion may include a protrusion that protrudes downward.

The foreign-matter guide portion may be inclined downward as the guide portion extends outwardly of the case body.

The foreign-matter guide portion may be inclined downward as the guide portion extends from a central portion thereof to each of laterally opposite ends thereof.

The foreign-matter guide portion may include a lateral portion that extends in a lateral direction along the outer surface of the case body, and at least one side wall portion that extends downward from an end of the lateral portion.

A part of the outer surface of the case body may be formed to protrude outward so as to provide the foreign-matter guide portion.

The seal structure may be in the form of an O ring.

The foreign-matter guide portion may be in the form of a wall along which water containing foreign matter flows.

The storage case according to the above aspect of the invention includes the seal structure, and assures improved water resistance at a reduced cost.

BRIEF DESCRIPTION OF THE DRAWINGS

The foregoing and further objects, features and advantages of the invention will become apparent from the following description of preferred embodiments with reference to the accompanying drawings, wherein like numerals are used to represent like elements and wherein.

DETAILED DESCRIPTION OF PREFERRED EMBODIMENTS

Some embodiments of the invention will be described in detail with reference to the drawings. In the drawings, the same reference numerals are used for identifying the same or corresponding elements or portions, of which explanation will not be repeated.

Figure 1:
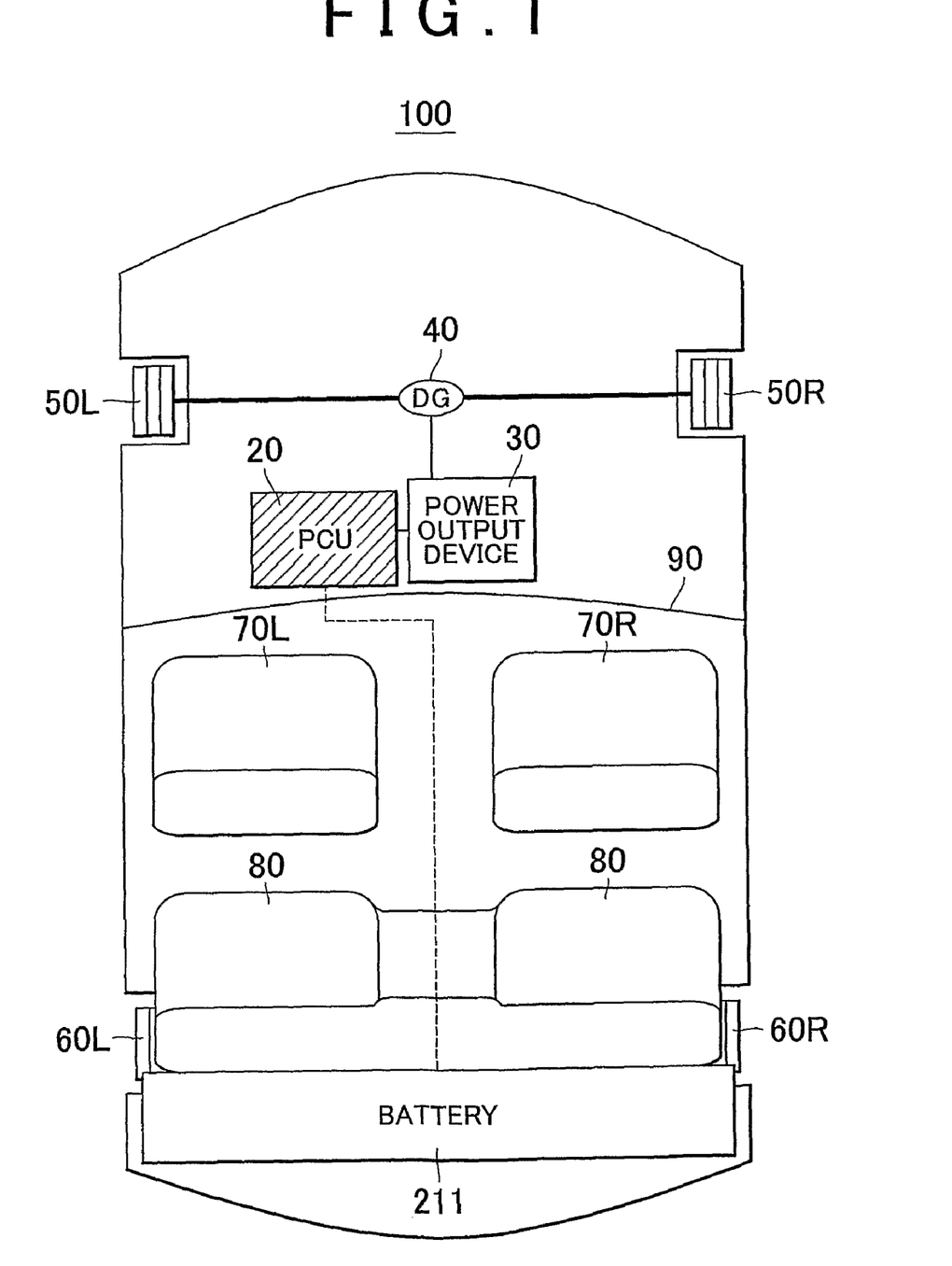
FIG. 1 is a plan view schematically showing the construction of a hybrid vehicle as an example of automobiles on which a PCU case according to one embodiment of the invention is installed.

FIG. 1 is a plan view schematically showing the construction of a hybrid vehicle as an example of automobiles on which a Power Control Unit (PCU) case according to one embodiment of the invention is installed.

As shown in FIG. 1, the hybrid vehicle 100 includes a battery 211, a PCU (Power Control Unit) 20, a power output device 30, a differential gear unit (DG) 40, front wheels S0L, 50R, rear wheels 60L, 60R, front seats 70L, 70R and rear seats 80.

The battery 211 serving as a "direct current (dc) power supply" or "do voltage source" consists of a secondary battery in the form of, for example, a nickel-metal hydride battery or a lithium battery. The battery 211 supplies dc voltage to the PCU 20, and is charged with dc voltage supplied from the PCU 20. The battery 211 is disposed behind the rear seats 80.

The power output device 30 is mounted in an engine room located in front of a dashboard 90. The PCU 20 is electrically connected with the power output device 30. The power output device 30 is coupled to the differential gear unit 40.

The PCU 20 steps up the dc voltage from the battery 211, and converts the raised dc voltage to ac voltage for use in control of driving of a motor generator included in the power output device 30. The PCU 20 also converts ac voltage generated by the motor generator of the power output device 30 to dc voltage, and charges the battery 21 with the dc voltage. Namely, the PCU 20 serves as a "power supply device" that performs power conversion between dc power supplied by the battery 211 and ac power for use in control of driving of the motor generator.

The power output device 30 transmits power produced by the engine and/or motor generator to the front wheels 50L, 50R via the differential gear unit 40, so as to drive the front wheels 50L, 50R. The power output device 30 also generates electric power by using rotational energy of the front wheels 50L, 50R, and supplies the thus generated power to the PCU 20. Thus, the motor generator functions as an "ac motor" capable of driving at least one wheel.

The differential gear unit 40 transmits power from the power output device 30 to the front wheels 50L, 50R, and transmits the rotational energy of the front wheels 50L, 50R to the power output device 30.

The PCU 20 is disposed in the engine room in which the power output device 30 is mounted. It is thus preferable that the PCU 20 be small in size.

Figure 2:
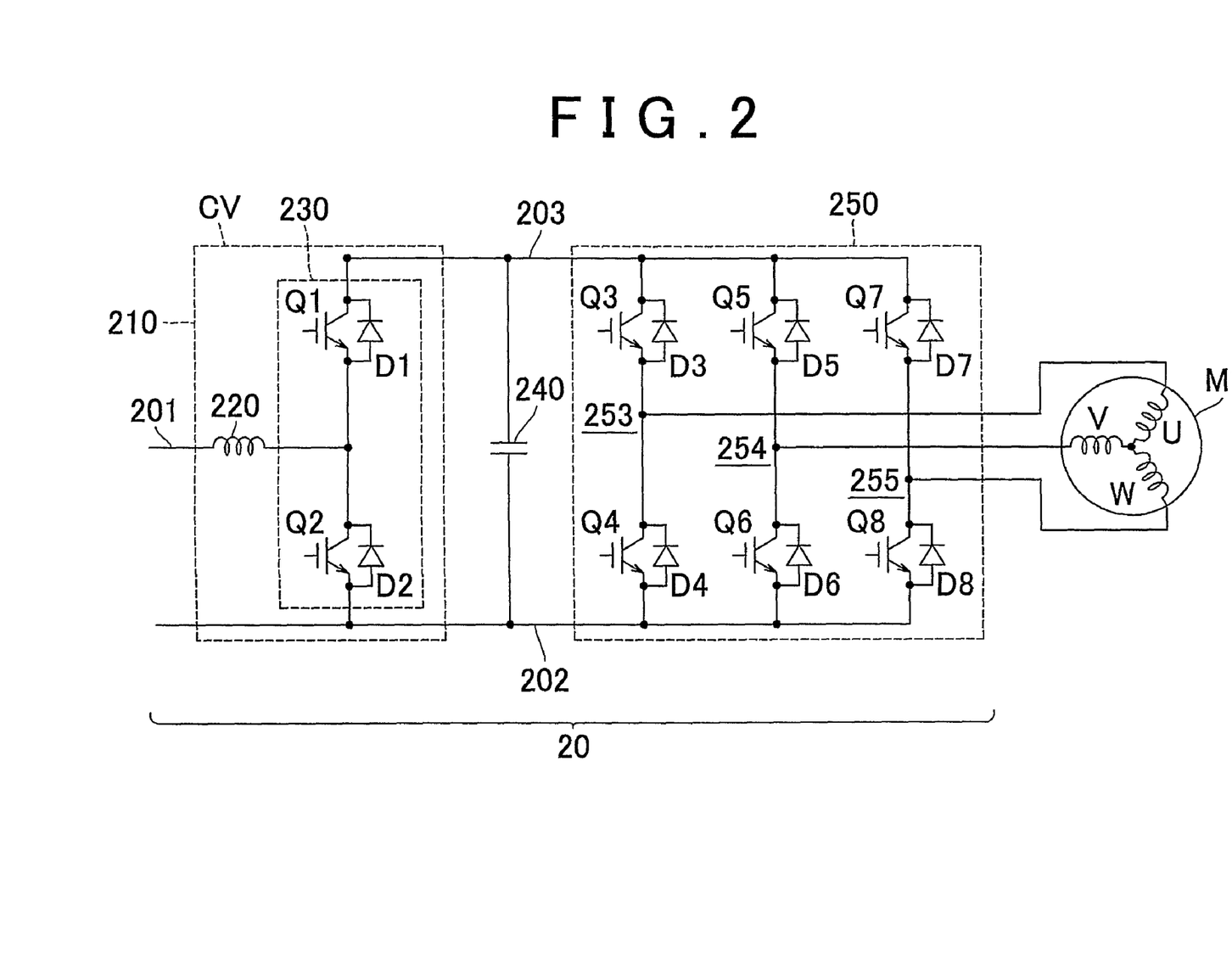
FIG. 2 is an electric circuit diagram showing a principal part of a PCU shown in FIG. 1.

FIG. 2 is an electric circuit diagram showing a principal part of the PCU 20 shown in FIG. 1. As shown in FIG. 2, the PCU 20 includes a converter 210 serving as a step-up chopper, a smoothing capacitor 240, and an inverter 250. The converter 210 has a reactor device 220 and a step-up module 230.

The step-up module 230 includes transistors 91, 92 and diodes D1, D2. The transistors Q1, Q2 are connected in series between a power supply line 203 and an earth line 202. The transistor Q1 has a collector connected to the power supply line 203, and an emitter connected to a collector of the transistor Q2. An emitter of the transistor Q2 is connected to the earth line 202. The diode D1, D2 is connected between the collector and emitter of each of the transistors Q1, 92 so as to allow current to flow from the emitter to the collector.

The reactor device 220 is connected at one end to a power supply line 201, and is connected at the other end to a point between the transistor Q1 and the transistor Q2. More specifically, the reactor device 220 is connected to a point between the emitter of the transistor Q1 and the collector of the transistor Q2. The smoothing capacitor 240 is connected between the power supply line 203 and the earth line 202.

The inverter 250 includes a U-phase arm 253, a V-phase arm 254 and a W-phase arm 255. The U-phase arm 253, V-phase arm 254 and W-phase arm 255 are connected in parallel between the power supply line 203 and the earth line 202. The U-phase arm 253 includes transistors 93, Q4 connected in series, and the V-phase arm 254 includes transistors Q5, Q6 connected in series. The W-phase arm 255 includes transistors Q7, Q8 connected in series. A diode D3-D8 is connected between collector and emitter of each of the transistors Q3-Q8, respectively, so as to allow current from the emitter to the collector.

An intermediate paint of each of the U-phase arm 253, V-phase arm 254 and W-phase arm 255 is connected to an end of a corresponding one of U-phase, V-phase and W-phase coils of the motor generator M1. The motor generator M1 is a three-phase permanent-magnet motor, in which three coils of U, V and W phases are connected at one end thereof to a common, middle point. The other end of the U-phase coil is connected to an intermediate point of the transistors Q3, Q4, and the other end of the V-phase coil is connected to an intermediate point of the transistors Q5, Q6, while the other end of the W-phase coil is connected to an intermediate point of the transistors 97, Q8.

In the converter 210, dc voltage supplied from the battery 211 as shown in FIG. 1 is applied between the power supply line 201 and the earth line 202. Through switching control of the transistor Q2, the converter 210 steps up the dc voltage, and outputs the resulting voltage to the power supply line 203. The smoothing capacitor 240 smoothes the dc voltage of the power supply line 203, and supplies it to the inverter 250. The inverter 250 converts the dc voltage of the power supply line 203 to ac voltage for use in driving of the motor generator M1.

The inverter 250 converts ac voltage generated by the motor generator M1 to dc voltage, and supplies the dc voltage to the smoothing capacitor 240. The smoothing capacitor 240 smoothes the dc voltage from the motor generator M1, and supplies it to the converter 210. The converter 210 steps down the dc voltage from the smoothing capacitor 240, and supplies the resulting voltage to the battery 211 as shown in FIG. 1 and so forth.

As described above, the PCU 20 steps up the dc voltage from the battery 211 so as to drive the motor generator M1, and also supplies electric power generated by the motor generator M1 to the battery 211 and so forth.

Figure 3:
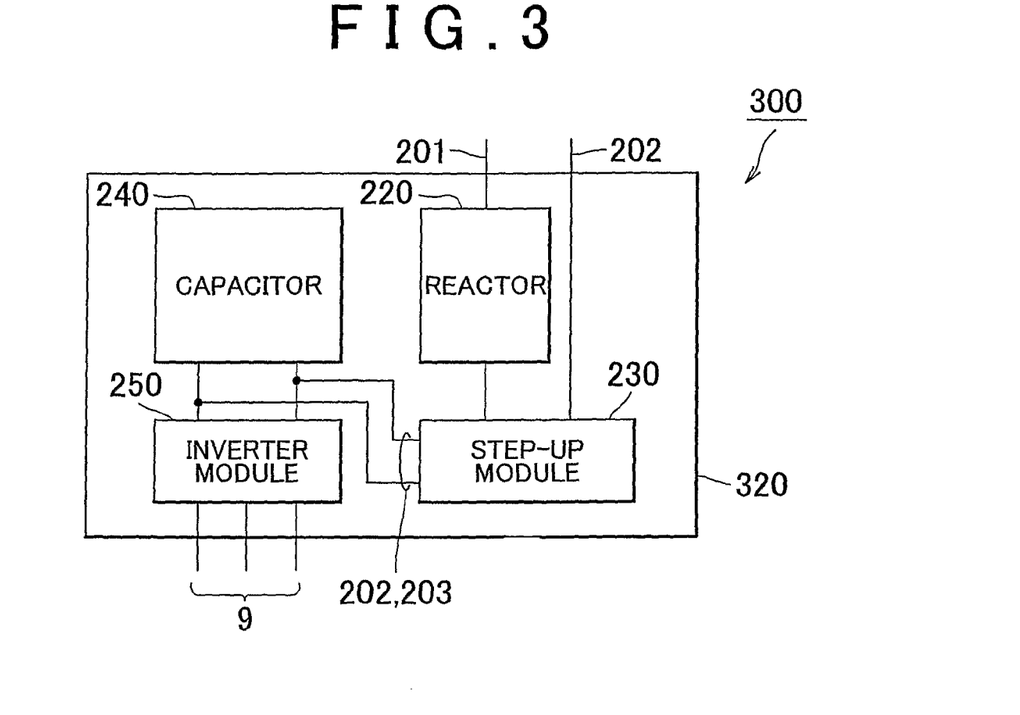
FIG. 3 is a view schematically showing the PCU case and its contents.

FIG. 3 schematically shows a PCU case 300 and its contents. As shown in FIG. 3, the PCU case 300 has a PCU case body 320 that contains power supply units, such as the reactor device 220, step-up module 230, smoothing capacitor 240 and the inverter 250.

The PCU case 300 is provided with a connector (connecting device) 9 that is electrically connected to the inverter 250.

Figure 4:
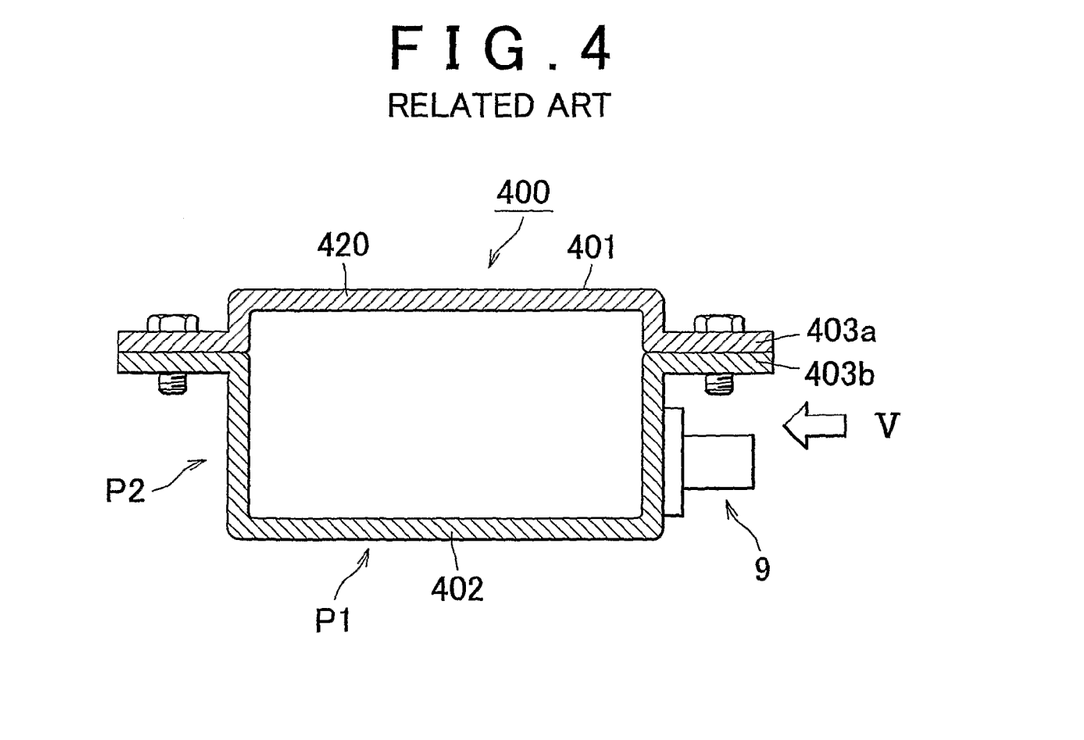
FIG. 4 is a cross-sectional view schematically showing the construction of a PCU case as a related art of the invention.
Figure 5:
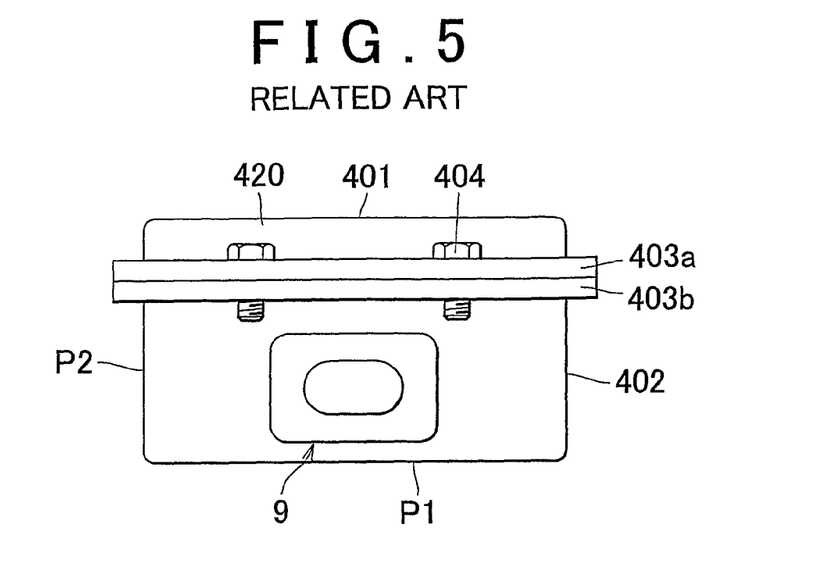
FIG. 5 is a view of the PCU case of FIG. 4 as viewed in a direction of arrow V in FIG. 4.

FIG. 4 is a cross-sectional view schematically showing the construction of a PCU case 400 as a related art of the invention. FIG. 5 is a view of the PCU case 400 of FIG. 4 as viewed in the direction of arrow V in FIG. 4.

As shown in FIG. 4 and FIG. 5, a PCU case body 420 of the PCU case 400 includes a box portion 402 formed with an opening that opens upward in the vertical direction, and a lid portion 401 mounted on the box portion 402 so as to close the opening of the box portion 402. A flange 403a is formed around the outer periphery of the lid portion 401, and a flange 403b corresponding with the flange 403a is also formed around the periphery of the opening of the box portion 402. The flange 403a and the flange 403b are fastened to each other with bolts 404, or the like, so that the lid portion 401 and the box portion 402 are joined together to form the PCU case body 420, Namely, the PCU case body 420 is constructed by joining two or more members, such as the lid portion 402 and the box portion 403, with a joint structure consisting of the flanges 403a, 403b and the bolts 404. In the PCU case 400 thus constructed, the area of the bottom face (installation surface) P1 of the PCU case body 420 is larger than any one of the areas of side faces P2 that are continuously formed around the bottom face P1.

The connector 9 is disposed on an outer surface of the PCU case body 420 which is located below the flanges 403a, 403b. In the PCU case 400, even if a liquid substance, such as water, containing foreign matter contacts the surface of the PCU case body 420, and the liquid substance flows or moves down on the surface of the PCU case body 420, the flanges 403a, 403b prevent the liquid substance from reaching the connector 9.

It is, however, necessary to reduce the area of installation of the PCU case 400 so as to mount various components or devices in a limited space of the engine room.

As one method for reducing the area of installation of the PCU case 400, it may be considered to rotate the PCU case body 420 so that a side face P2 (selected from the surrounding side faces of the PCU case body 420) that is smaller than the bottom face P1 is located at the bottom of the case body 420 to provide a bottom face thereof.

Figure 6:
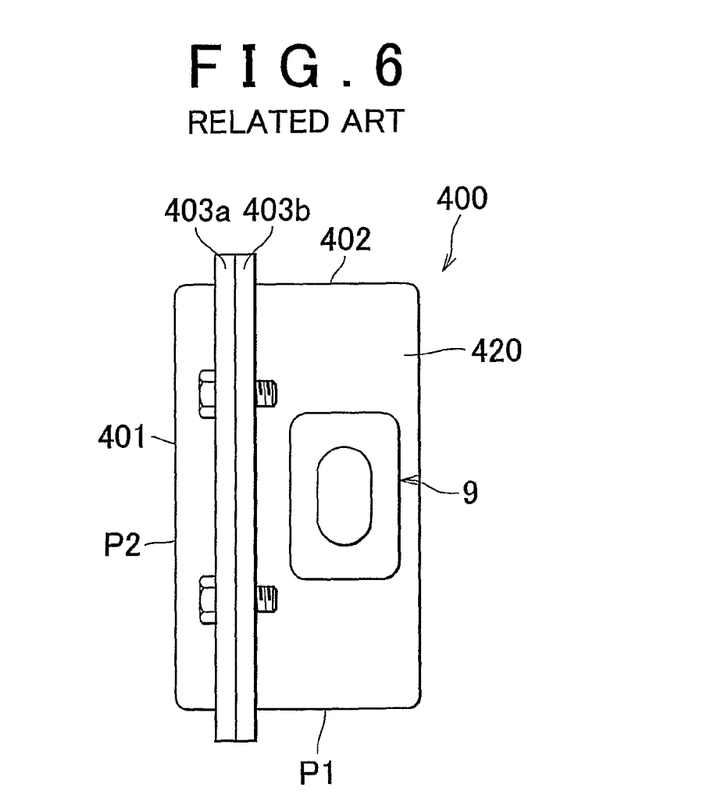
FIG. 6 is a view schematically showing the PCU case as the related art of the invention in a condition in which a PCU case body is rotated and mounted in place so that the area of installation of the PCU case is reduced.

FIG. 6 schematically shows a condition in which the PCU case body 420 is rotated and mounted in place so that the area of installation of the PCU case 400 is reduced.

With the PCU case body 420 thus rotated, the flanges 403a, 403b are located at one side of the connector 9, as shown in FIG. 6. In this condition, if a liquid substance containing foreign matter contacts an upper part of the PCU case body 420 above the connector 9, the liquid substance may drop and reach the connector 9.

In view of the above-described situation of the related art, the PCU case 300 of the present embodiment is provided with a foreign-matter guide portion, aside from the flanges, in order to prevent the connector 9 from being subjected to a liquid substance that flows down on the wall surface, while achieving a reduction of the installation area.

Figure 7:
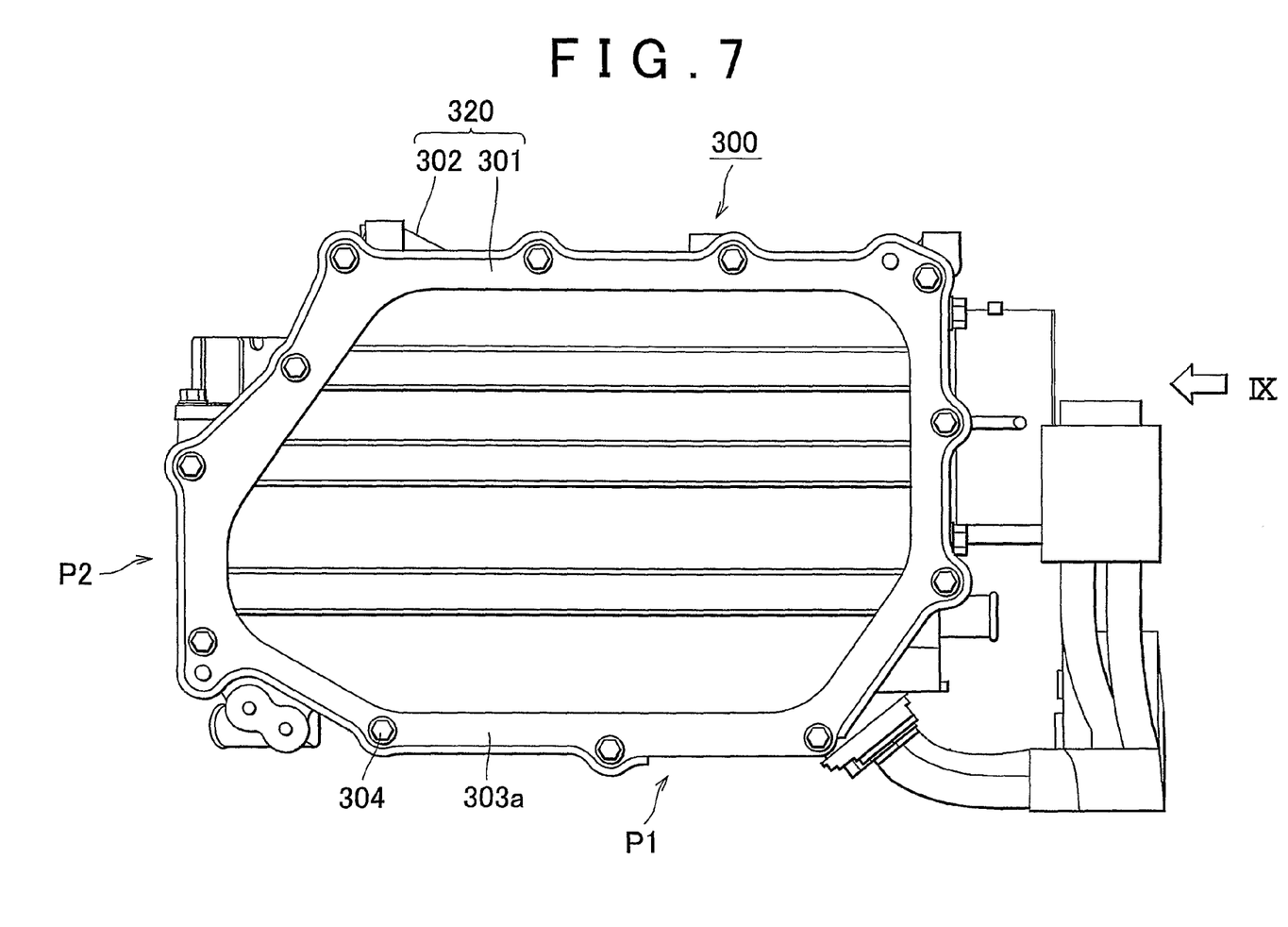
FIG. 7 is a side view of the PCU case according to the embodiment of the invention.

FIG. 7 is a side view of the PCU case 300 according to the present embodiment of the invention. Like the PCU case 400 as described above, the PCU case 300 of this embodiment includes a PCU case body 320 that contains power supply units, as shown in FIG. 7. The PCU case body 320 is constructed by joining a box portion (member) 302 formed at one side thereof with an opening, with a lid portion (member) 301 that closes the opening of the box portion 302. A flange 303a is formed around the outer periphery of the lid portion 301.

The PCU case 300 is installed in place such that the area of the bottom face P1 is smaller than that of at least one side face P2, out of a plurality of side faces P2 continuously formed around the bottom face P1.

Figure 8:
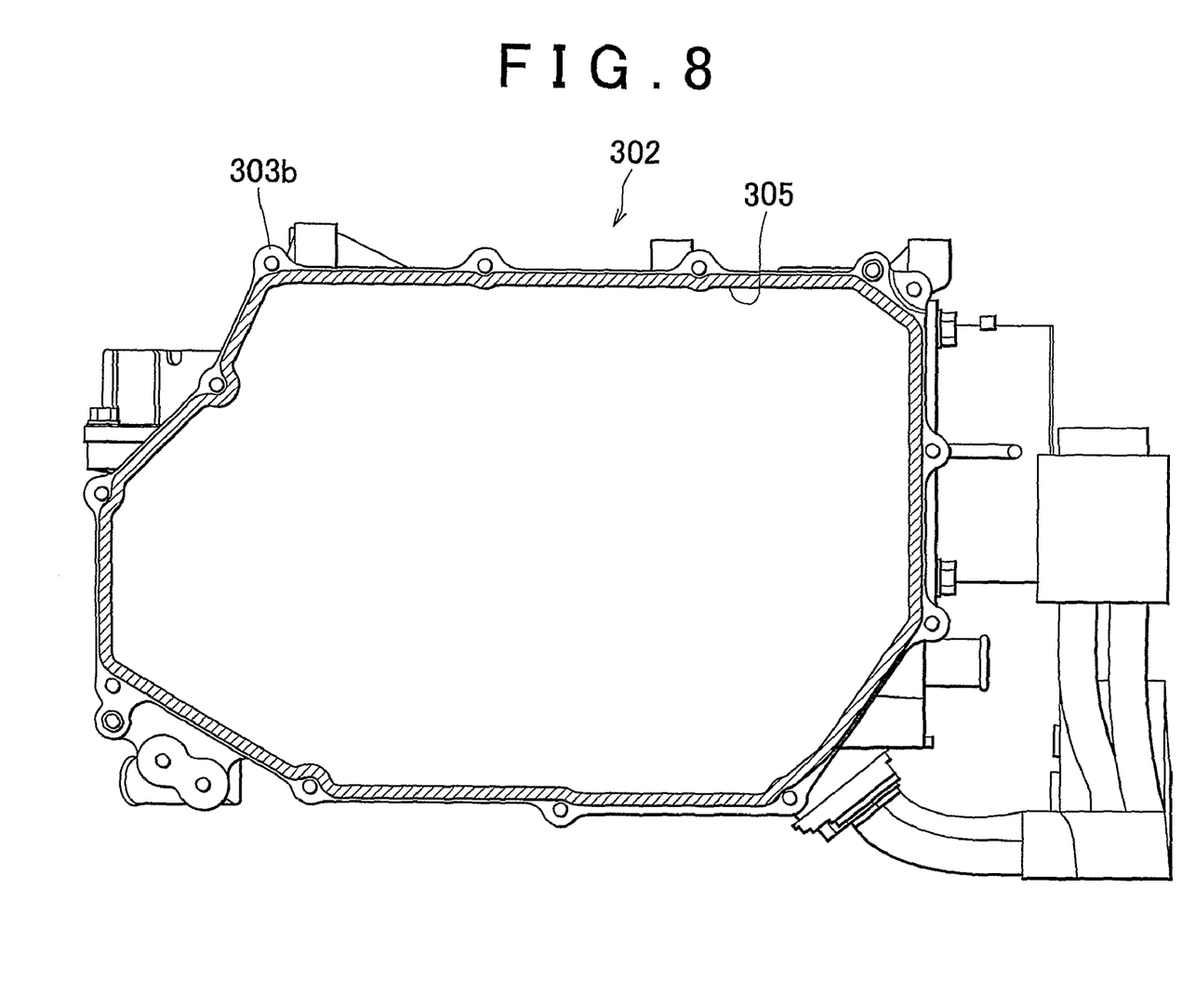
FIG. 8 is a side view showing a box portion of the PCU case of FIG. 7.

FIG. 8 is a side view of the box portion 302. As shown in FIG. 8, a flange 303b corresponding with the flange 303a is formed around the periphery of the opening of the box portion 302 such that the flange 303b protrudes outwards. The flange 303b and the flange 303a are joined together by means of bolts 304, or the like, as shown in FIG. 7.

Figure 9:
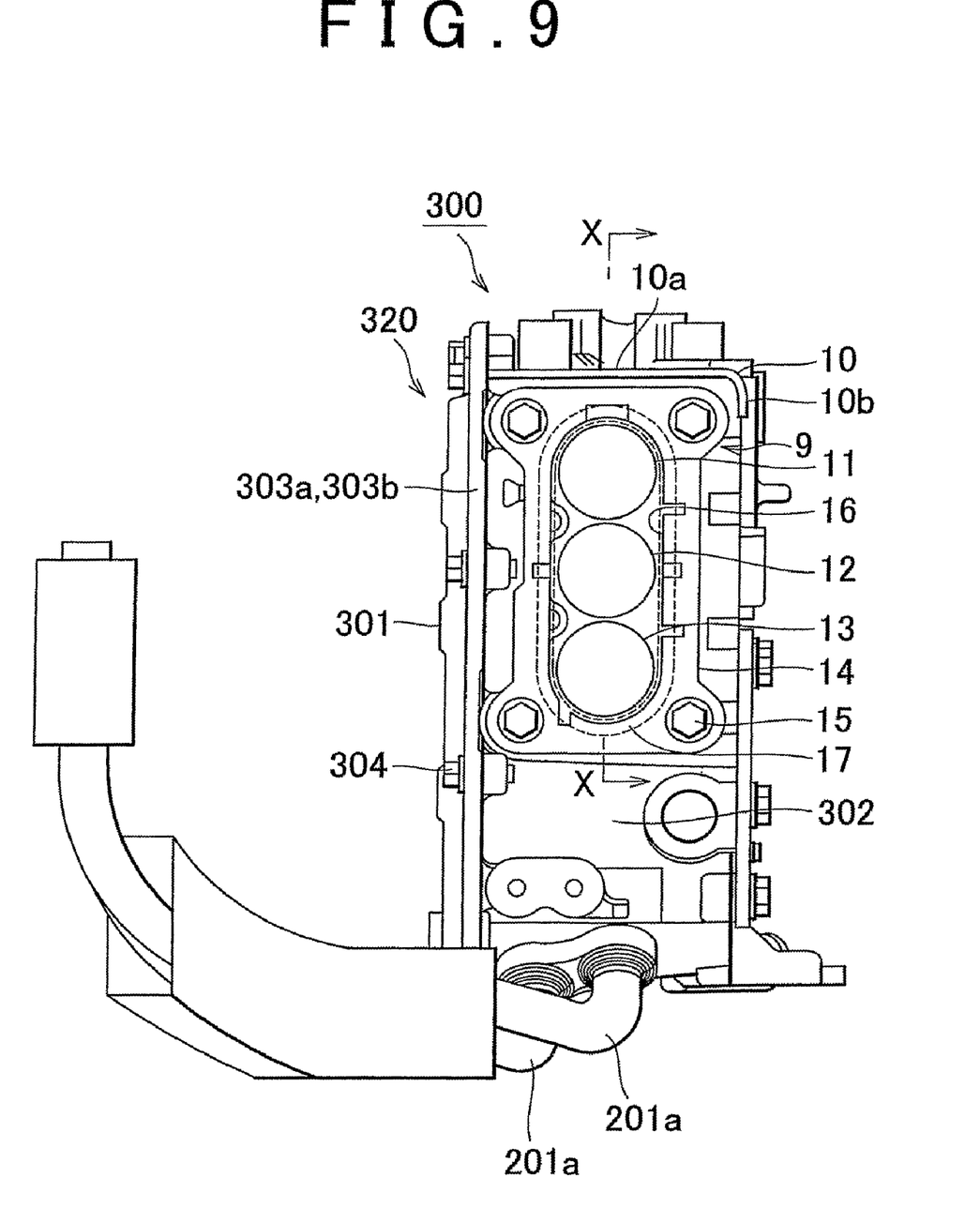
FIG. 9 is a view of the PCU case as viewed in a direction of arrow IX in FIG. 7.
Figure 10:
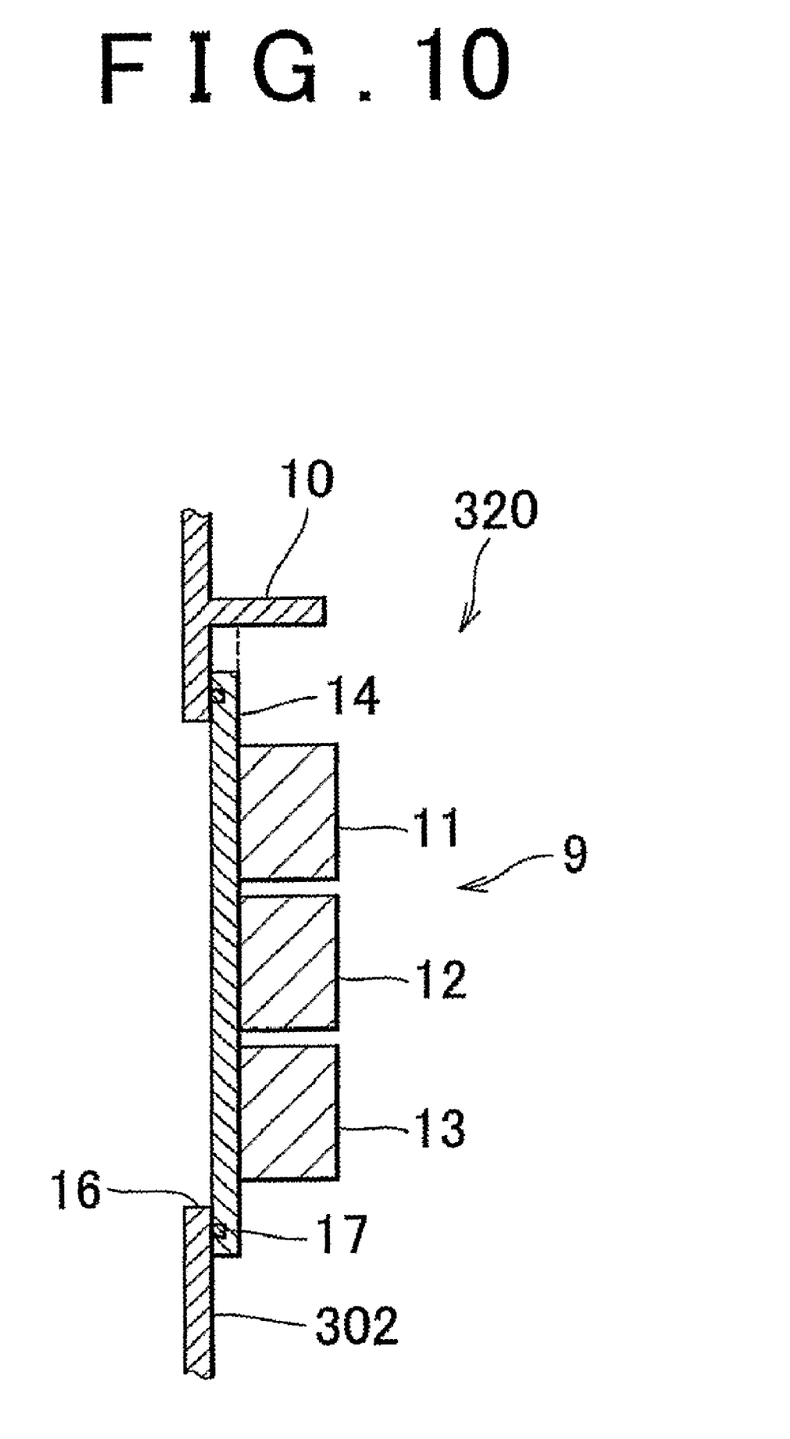
FIG. 10 is a cross-sectional view showing a section taken along line X-X in FIG. 9.

FIG. 9 is a view of the PCU case 300 as viewed in the direction of arrow IX in FIG. 7, and FIG. 10 is a cross-sectional view showing a section taken along line X-X in FIG. 9.

As shown in FIG. 9 and FIG. 10, the connector 9 as a connecting device is provided on one side face of the PCU case body 320, and a foreign-matter guide portion (wall) 10 is provided on a surface of the PCU case body 320 which is located above the connector 9 in the vertical direction.

The connector 9 is disposed on a base (closure member) 14 in the form of a flat plate, which is provided for closing an opening 16 formed in one side face of the box portion 302. The connector 9 includes a U-phase connector 11, a V-phase connector 12 and a W-phase connector 13, which are disposed on the base 14.

A generally annular seal member 17 in the form of, for example, an O ring is provided between the base 14 and the outer surface of the PCU case body 320.

By fastening the base 14 to the box portion 302 using bolts 15 as shown in FIG. 9, the seal member 17 is pressed against the periphery of the opening 16 (i.e., a portion of the box portion 302 which defines the opening 16), so as to provide seal between the base 14 and the PCU case body 320.

The foreign-matter guide portion 10 is formed, separately from the flanges 303a, 303b, on an upper portion of the outer surface of the PCU case body 320 which is located above the connector 9 in the vertical direction.

With the above arrangement, even if a liquid substance, such as water or oil, containing foreign matter contacts the surface of the PCU case body 320 located above the foreign-matter guide portion 10, and moves down on the surface, the foreign-matter guide portion 10 inhibits the liquid substance from reaching the base 14.

Since the liquid substance is inhibited from reaching the base 14 as described above, the seal member 17 can be prevented from being corroded or chemically attacked by the foreign matter contained in the liquid substance. Also, entry of water, or the like, into the PCU case body 320 is inhibited, and the devices or components stored in the PCU case body 320 can be thus prevented from being subjected to the water. The power supply units stored in the PCU case body 320, including high-voltage electric devices, are highly required to be protected against water; therefore, the provision of the foreign-matter guile portion 10 on the PCU case body 320 is considerably effective or advantageous at enhancing the protection of the power supply units.

As shown in FIG. 10, the foreign-matter guide portion 10 protrudes from the outer surface of the PCU case body 320, such that the distal end of the guide portion 10 is located outwardly of the base 14.

With the above arrangement, the liquid substance that flows down from above the foreign-matter guide portion 10 is guided by the foreign-matter guide portion 10 to its distal end located outwardly of the base 14. The liquid substance then falls in drops from the distal end portion of the foreign-matter guide portion 10. At this time, the liquid substance falls on a position located outwardly of the interface between the base 14 and the PCU case body 320, and, therefore, the seal member 17 is prevented from being subjected to the liquid substance that has fallen from the foreign-matter guide portion 10.

In FIG. 9, one end of the foreign-matter guide portion 10 as viewed in the lateral direction is located outwardly of one lateral end of the base 14, and is connected with the flange 303b that extends from a vertical level above the base 14 down to a level below the base 14.

With the above arrangement, one of the opposite sides of the base 14 located closer to the flange 303b and the upper side of the base 14 are covered with the foreign-matter guide portion 10 and the flange 303b, and, therefore, the liquid substance is prevented from entering the interface between the PCU case body 320 and the base 14.

Furthermore, the other lateral end of the foreign-matter guide portion 10 is located outwardly of the other lateral end of the base 14, and is formed with a side wall portion 10b that extends downwards in the vertical direction.

With the above arrangement, a liquid substance that falls in drops from the other end of the foreign-matter guide portion 10 is prevented from reaching the base 14 and entering the interface between the base 14 and the PCU case body 32.

The foreign-matter guide portion 10 is formed using a mold having an integral pattern of the foreign-matter guide portion 10 and the box portion 302 on which the foreign-matter guide portion 10 is located. Thus, the foreign-matter guide portion 10 can be formed simultaneously with the box portion 302, and the number of manufacturing steps can be reduced as compared with the case where the foreign-matter guide portion 10 is welded to the box portion 302 later. Also, the foreign-matter guide portion 10 thus formed as an integral part of the box portion 302 ensures a sufficiently high strength.

The foreign-matter guide portion 10 formed as described above prevents or inhibits the liquid substance from entering the interface between the connector 9 and the PCU case body 320.

Figure 11:
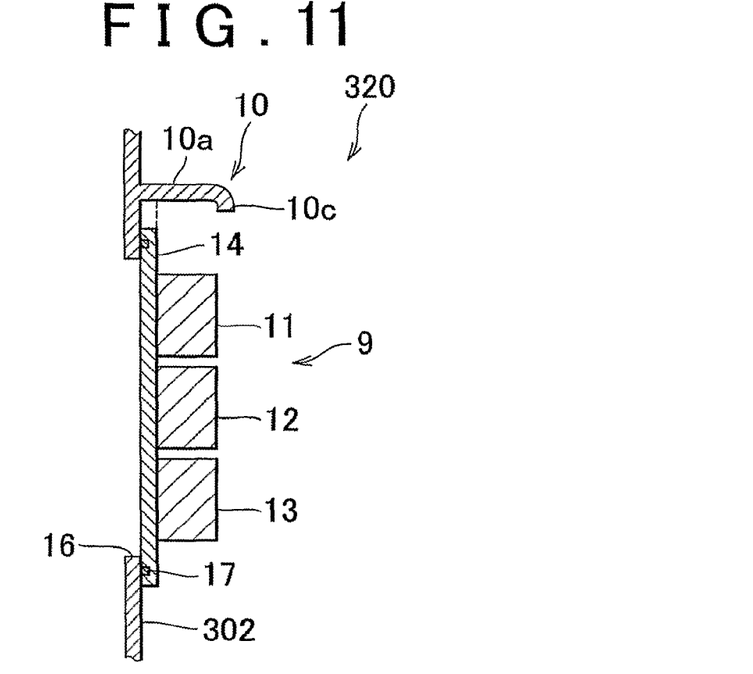
FIG. 11 is a cross-sectional view showing a first modified example of a foreign-matter guide portion.

It is to be understood that the shape of the foreign-matter guide portion 10 is not limited to that of the embodiment as described above. FIG. 11 shows a first modified example of the foreign-matter guide portion 10.

As shown in FIG. 11, the foreign-matter guide portion 10 includes a top plate 10a that is located above the connector 9 and protrudes outwardly of the base 14, and a protrusion 10c that protrudes downward from the distal end of the top plate 10a.

With the protrusion 10c thus provided, a liquid substance that reaches the distal end of the top plate 10a is guided downward by the protrusion 10c, and falls vertically from the lower end portion of the protrusion 10c. Thus, the liquid substance that has moved on the upper surface of the foreign-matter guide portion 10 is prevented from moving on the lower surface of the foreign-matter guide portion 10 and reaching the surface of the PCU case body 320 again.

The position of the protrusion 10e is not limited to that of the example as described above, but may be selected as desired provided that the protrusion 10c is formed on the lower surface of the top plate 10a and is located outwardly of the base 14.

Figure 12:
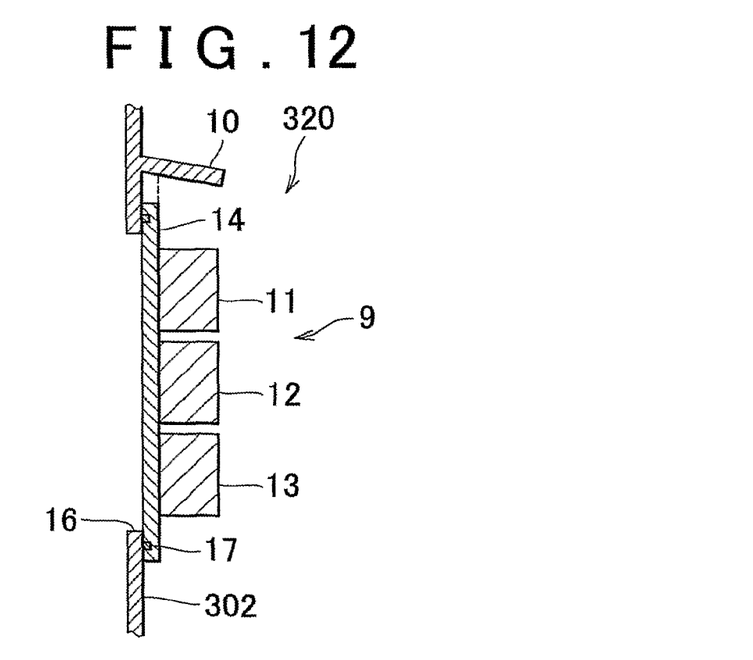
FIG. 12 is a cross-sectional view showing a second modified example of the foreign-matter guide portion.

FIG. 12 is a cross-sectional view showing a second modified example of the foreign-matter guide portion 10. As shown in FIG. 12, the upper surface of the foreign-matter guide portion 10 is inclined downward as the guide portion 10 extends outwardly of the PCU case body 320, namely, from the proximal end to the distal end thereof.

With the above arrangement, a liquid substance that falls on the upper surface of the foreign-matter guide portion 10 moves along the upper surface, and is successively discharged to the outside of the PCU case body 320. Thus, the liquid substance is prevented from remaining on the upper surface of the foreign-matter guide portion 10.

Also, as shown in FIG. 12, the lower surface of the foreign-matter guide portion 10 is formed as an inclined surface that is inclined downward as the guide portion 10 extends outwardly of the PCU case body 320. Thus, a liquid substance that has moved along the upper surface of the foreign-matter guide portion 10 is prevented from moving along the lower surface and reaching the PCU case body 320.

Figure 13:
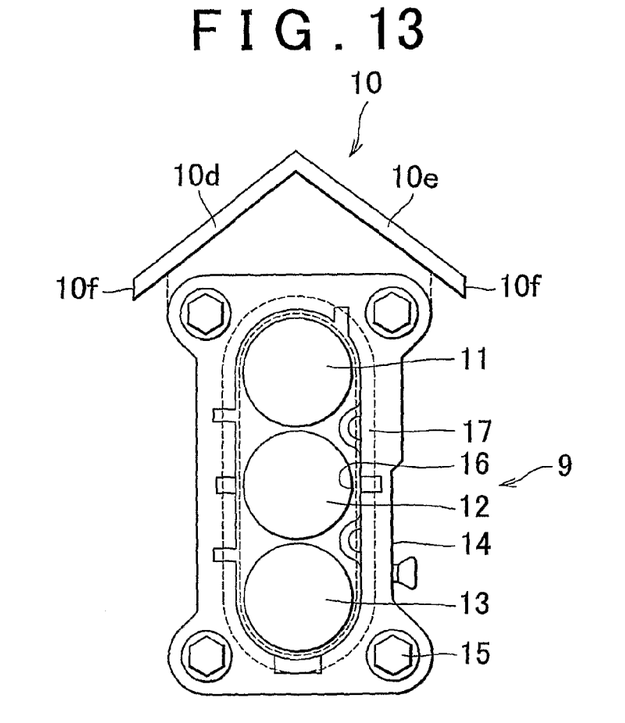
FIG. 13 is a front view showing a third modified example of the foreign-matter guide portion.

FIG. 13 is a front view showing a third modified example of the foreign-matter guide portion 10. As shown in FIG. 13, the foreign-matter guide portion 10 includes an inclined portion 10d that is inclined downward from a central portion to one of the laterally opposite ends thereof, and an inclined portion 10e that is inclined downward from the central portion to the other lateral end thereof. With this arrangement, a liquid substance that falls on the upper surface of the foreign-matter guide portion 10 is guided in the lateral directions, and falls in drops from the laterally opposite ends of the foreign-matter guide portion 10 which are located laterally apart from the base 14. The liquid substance, which is guided in the manner as described above, is prevented from contacting the U-phase connector 11, V-phase connector 12 and W-phase connector 13 of the connector 9.

Figure 14:
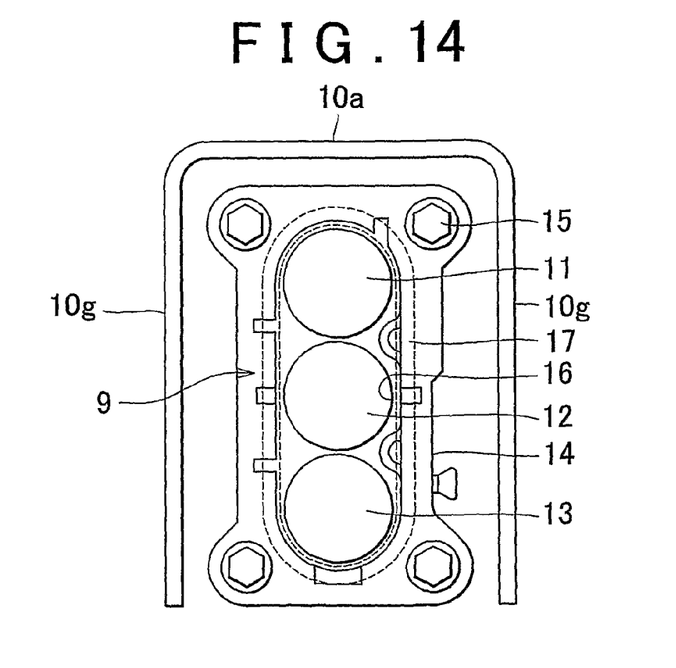
FIG. 14 is a front view showing a fourth modified example of the foreign-matter guide portion.

FIG. 14 is a front view showing a fourth modified example of the foreign-matter guide portion 10. As shown in FIG. 14, the foreign-matter guide portion 10 includes a top plate 10a formed on a surface of the PCU case body 320 which is located above the connector 9, and side walls 10g that hang or extend downward from the laterally opposite ends of the top plate 10a. The thus shaped foreign-matter guide portion 10 covers or surrounds the upper side and lateral sides of the connector 9, and is thus able to surely prevent a liquid substance from entering the interface between the connector 9 and the PCU case body 320.

Figure 15:
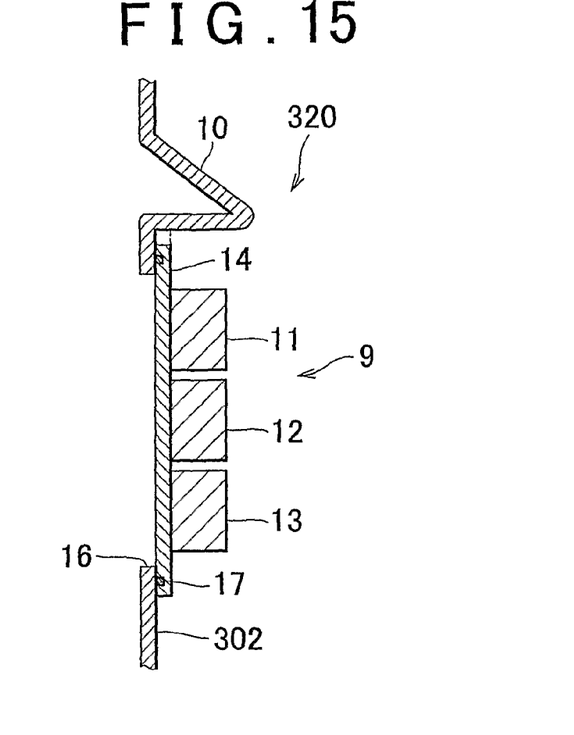
FIG. 15 is a cross-sectional view showing a fifth modified example of the foreign-matter guide portion.
Figure 16:
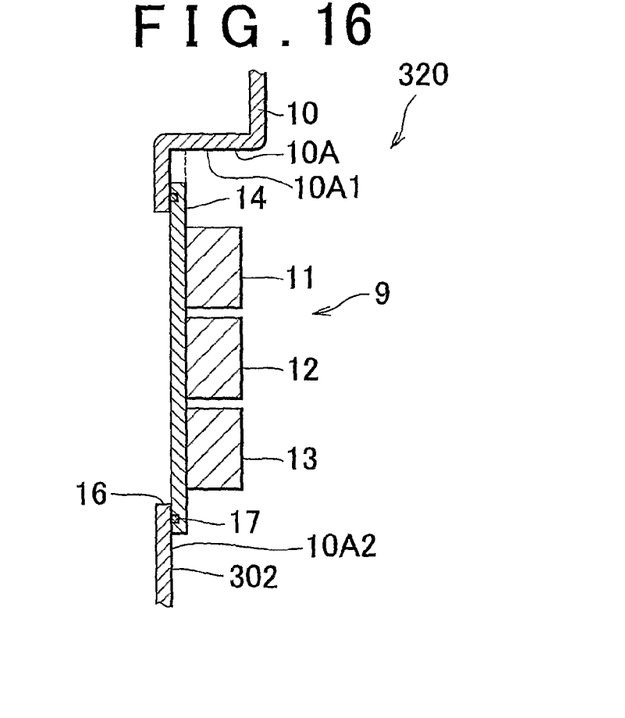
FIG. 16 is a cross-sectional view showing a sixth modified example of the foreign-matter guide portion.

FIG. 15 is a cross-sectional view showing a fifth modified example of the foreign-matter guide portion 10, and FIG. 16 is a cross-sectional view showing a sixth modified example of the foreign-matter guide portion 10. As shown in FIG. 15, the foreign-matter guide portion 10 may be formed by bending outwards a part of the wall of the PCU case body 320 which is located above the connector 9. Also, as shown in FIG. 16, a recess 10A may be formed in the PCU case body 320, and a part of the wall of the PCU case body 320 which defines the recess 10A may provide the foreign-matter guide portion 10.

The inner walls of the recess 10A include surrounding walls 10A1 including the foreign-matter guide portion 10, and a flat surface 10A2 on which the connector 9 is located. The flat surface 10A2 extends downward in the vertical direction in its region below the connector 9, as well as in its region on which the connector 9 is located, and, therefore, a liquid substance is prevented from remaining in the region below the connector 9.

While the invention is applied to the connector 9 of the PCU case 300 in the embodiment and modified examples of FIG. 7 through FIG. 16, the invention is not limitedly applied to the connector 9, but may be applied to a drain plug 306 formed on the PCU case body 320.

Figure 17:
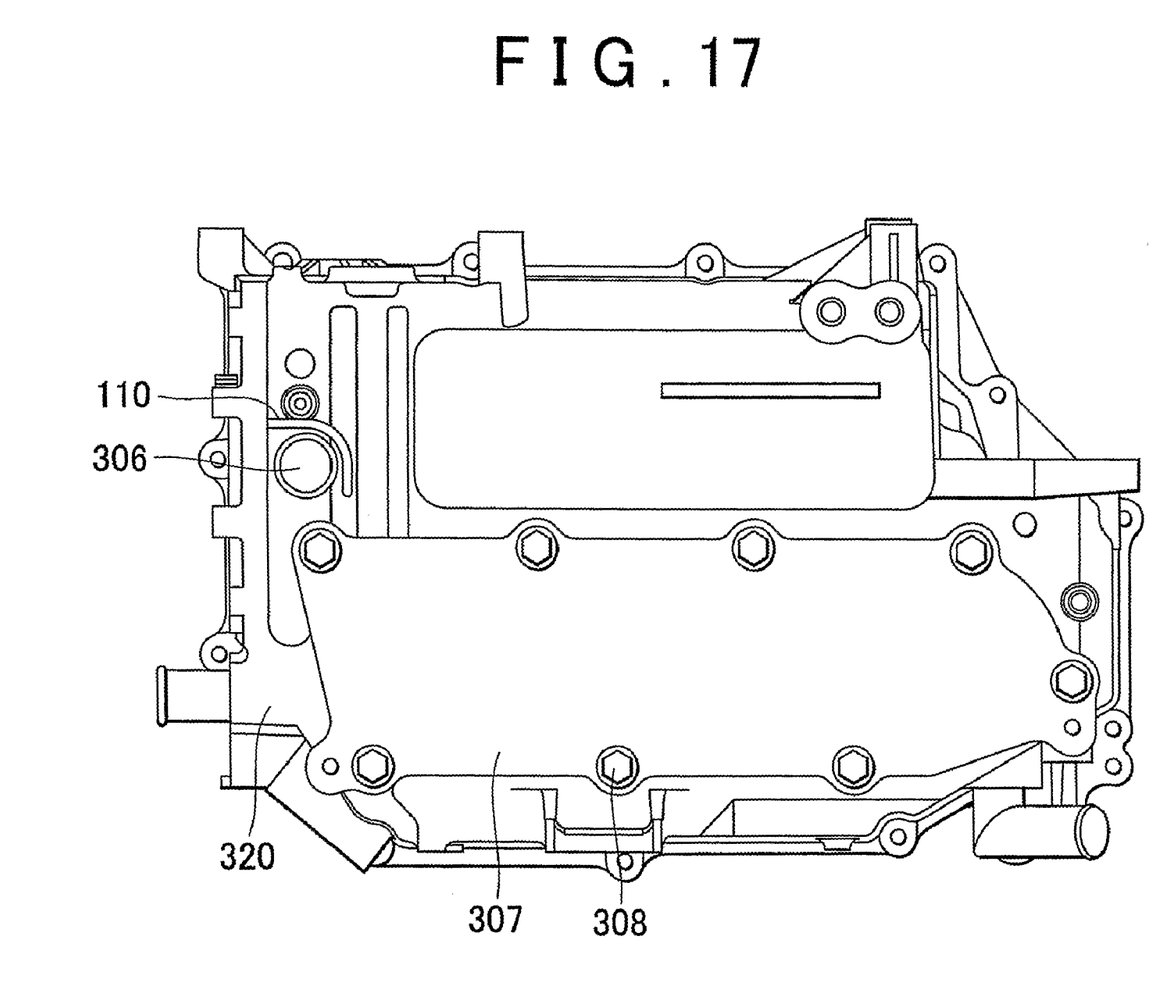
FIG. 17 is a side view showing a side face of the PCU case opposite to that of the PCU case as shown in FIG. 7.
Figure 18:
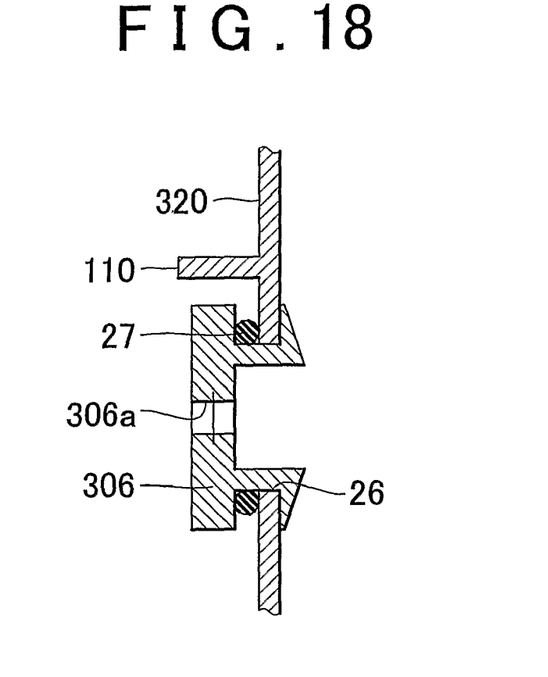
FIG. 18 is a cross-sectional view of a drain plug as shown in FIG. 17.

Referring to FIG. 17 and FIG. 18, another embodiment of the invention when applied to the drain plug will be described. FIG. 17 is a view of a side face of the PCU case 300 opposite to the side face of the PCU case 300 as shown in FIG. 7.

As shown in FIG. 17, the drain plug 306 through which outside air can be supplied into the PCU case 300 is formed on the side face of the PCU case 300.

FIG. 18 is a cross-sectional view of the drain plug 306 as shown in FIG. 17. As shown in FIG. 18, the drain plug (closure member) 306 is arranged to close an opening 26 formed in the PCU case body 320. An annular seal member 27, such as an O ring, is provided between the drain plug 306 and the outer surface of the PCU case body 320.

A foreign-matter guide portion 110 is formed on a surface of the PCU case body 320 which is located above the drain plug 306. The foreign-matter guide portion 110 protrudes outward from the PCU case body 34 so as to extend beyond the drain plug 306.

The foreign-matter guide portion 110 performs substantially the same function as the foreign-matter guide portion 10 as described above. Thus, the foreign-matter guide portion 110 can prevent a liquid substance from contacting the seal member 27 provided between the drain plug 306 and the PCU case body 320.

In the embodiments and examples of FIG. 7 through FIG. 18, the PCU case body 320 is constructed by joining two or more members with a joint portion consisting of the flanges 303a, 303b and the bolts 304. It is, however, to be understood that the PCU case body may be otherwise constructed.

For example, the lid portion 301 and box portion 302 of the PCU case body 320 may be joined together by welding.

Figure 19:
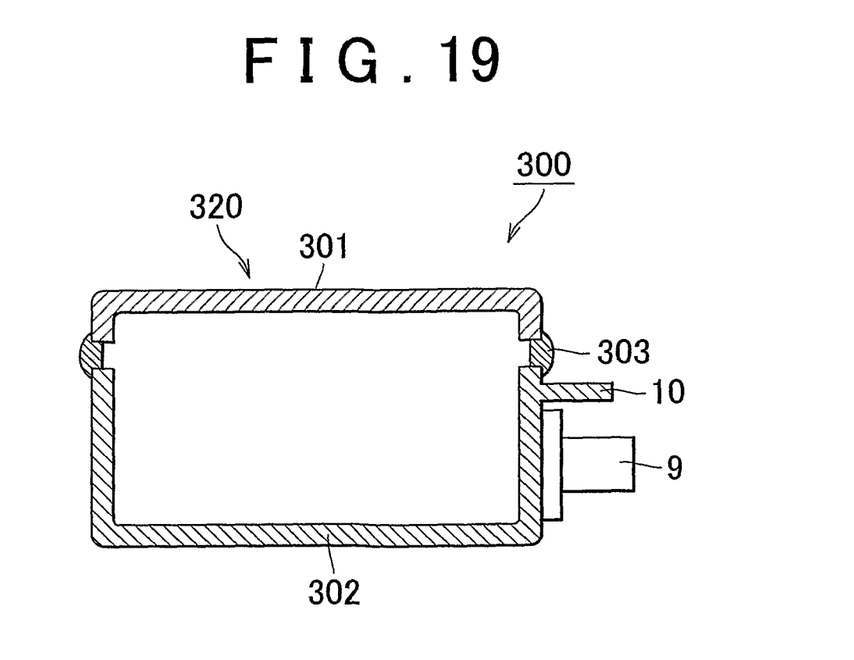
FIG. 19 is a cross-sectional view showing a PCU case body constructed by joining a lid portion and a box portion together by welding.

FIG. 19 is a cross-sectional view showing the PCU case body 320 constructed by joining the lid portion 301 and the box portion 302 by welding. In the PCU case 300 as shown in FIG. 19, too, the foreign-matter guide portion 10 is disposed above the connector 9 as viewed in the vertical direction.

The lid portion 301 and the box portion 302 are joined together with a joint structure that consists of a weld 303 formed on an end face of the lid portion 301 and an end face of the box portion 302, and end portions of the lid portion 301 and box portion 302 on which the weld 303 is deposited.

The weld 303 protrudes outwards from the outer surface of the PCU case body 320, by a reduced amount as compared with the amount of protrusion of the flanges provided in the previous embodiments or examples.

Namely, the amount of protrusion of the weld 303 is reduced to such an extent that a liquid substance that contacts a surface of the PCU case body 320 which is located above the weld 303 can pass over the weld 303 and flow down to a surface of the case body 320 located below the weld 303.

Thus, the PCU case body 320 formed using welding requires a reduced space or region for installation thereof, as compared with the PCU case body formed with the flanges, and the size of the PCU case 300 can be further reduced.

In the PCU case 300 as described above, too, the foreign-matter guide portion 10 prevents a liquid substance from flowing down to the connector 9, thus protecting the connector 9 against water or other liquid, in substantially the same manner as in the previous embodiments or examples.

The invention is favorably applied to a storage case, in particular, a storage case that contains electric devices or equipment.

While the invention has been described with reference to what are considered to be preferred embodiments thereof, it is to be understood that the invention is not limited to the disclosed embodiments or constructions. On the contrary the invention is intended to cover various modifications and equivalent arrangements. In addition, while the various elements of the disclosed invention are shown in various combinations aid configurations, which are exemplary, other combinations and configurations, including more, less or only a single element, are also within the scope of the appended claims.

The invention claimed is:

1. A storage case for a three-phase AC inverter comprising:
   a case body formed by joining a plurality of members with a joint structure;
   an opening formed in the case body;
   a closure member capable of closing the opening;
   a seal structure provided between the case body and the closure member; and
   a portion for guiding a foreign matter provided on an outer surface of the case body, aside from the joint structure, such that the portion for guiding a foreign matter is located above the seal structure in a vertical direction of the storage case,
   wherein the closure member is provided on the outer surface of the case body,
   wherein a bolt fastens the closure member to the case body,
   wherein the portion for guiding a foreign matter protrudes outward from the outer surface of the case body so as to extend beyond the closure member, and
   wherein the portion for guiding a foreign matter is located above the closure member, and opposite ends of the portion for guiding a foreign matter are positioned further outward, in a lateral direction of the closure member, than the opposite ends of the closure member.

2. A storage case according to claim 1, further comprising an inverter that is housed in the case body and is capable of functioning as a power converter, wherein
   the closure member is provided with a connecting device to which a coupling member for electrically coupling the inverter with an electric device located outside the case body can be connected.

3. A storage case according to claim 1, wherein the closure member comprises a drain plug through which outside air can be supplied into the storage case.

4. A storage case according to claim 1, wherein one of said plurality of members forming the case body is provided with the portion for guiding a foreign matter, and said one of said plurality of members is formed using a mold having an integral pattern of said one of said plurality of members and the portion for guiding a foreign matter.

5. A storage case according to claim 1, wherein the case body is formed by joining said plurality of members by welding.

6. A storage case according to claim 1, wherein the portion for guiding a foreign matter includes a protrusion that protrudes downward.

7. A storage case according to claim 1, wherein the portion for guiding a foreign matter is inclined downward as the guide portion extends outwardly of the case body.

8. A storage case according to claim 1, wherein the portion for guiding a foreign matter is inclined downward as the guide portion extends from a central portion thereof to each of laterally opposite ends thereof.

9. A storage case according to claim 1, wherein the portion for guiding a foreign matter includes a lateral portion that extends in a lateral direction, and at least one side wall portion that extends downward from an end of the lateral portion.

10. A storage case according to claim 1, wherein a part of the outer surface of the case body is formed to protrude outward so as to provide the portion for guiding a foreign matter.

11. A storage case according to claim 1, wherein the seal structure comprises an O ring.

12. A storage case according to claim 1, wherein the portion for guiding a foreign matter comprises a wall along which water containing foreign matter flows.

13. A storage case for a three-phase AC inverter comprising:
  a case body formed by joining a plurality of members with a joint structure;
  an opening formed in the case body;
  a closure member capable of closing the opening;
  a seal structure provided between the case body and the closure member; and
  a portion for guiding a foreign matter provided on an outer surface of the case body, aside from the joint structure, such that the portion for guiding a foreign matter is located above the seal structure in a vertical direction of the storage case,
  wherein the closure member is inserted into the opening,
  wherein the seal structure is provided between the outer surface of the case body and the closure member,
  wherein the portion for guiding a foreign matter protrudes outward from the outer surface of the case body so as to extend beyond the closure member,
  wherein the portion for guiding a foreign matter is located above the closure member, and opposite ends of the portion for guiding a foreign matter are positioned further outward, in a lateral direction of the closure member, than the opposite ends of the closure member, and
  wherein the closure member comprises a drain plug through which outside air can be supplied into the storage case.

* * * * *